US012785045B2

(12) United States Patent
Nakagawa et al.

(10) Patent No.: US 12,785,045 B2
(45) Date of Patent: Nov. 3, 2026

(54) MICROWAVE PLASMA GENERATING APPARATUS, MICROWAVE PLASMA PROCESSING APPARATUS, AND MICROWAVE PLASMA PROCESSING METHOD

(71) Applicant: Abit Technologies Co., LTD., Tokyo (JP)

(72) Inventors: Kiyokazu Nakagawa, Tokyo (JP); Yoshihisa Usami, Tokyo (JP)

(73) Assignee: ABIT TECHNOLOGIES CO., LTD, Tokyo (JP)

( * ) Notice: Subject to any disclaimer, the term of this patent is extended or adjusted under 35 U.S.C. 154(b) by 102 days.

(21) Appl. No.: 18/995,530

(22) PCT Filed: Jul. 26, 2023

(86) PCT No.: PCT/JP2023/027318
§ 371 (c)(1),
(2) Date: Jan. 16, 2025

(87) PCT Pub. No.: WO2024/024817
PCT Pub. Date: Feb. 1, 2024

(65) Prior Publication Data
US 2026/0253841 A1 Aug. 27, 2026

(30) Foreign Application Priority Data
Jul. 27, 2022 (JP) ................................ 2022-119771

(51) Int. Cl.
*H01J 37/32* (2006.01)

(52) U.S. Cl.
CPC .... *H01J 37/3244* (2013.01); *H01J 37/32201* (2013.01); *H01J 37/32467* (2013.01);
(Continued)

(58) Field of Classification Search
CPC ............. H01J 37/3244; H01J 37/32201; H01J 37/32467; H01J 37/32541; H01J 37/32834; H01J 2237/334
See application file for complete search history.

(56) References Cited

U.S. PATENT DOCUMENTS

| | | | | |
|---|---|---|---|---|
| 2005/0212626 A1* | 9/2005 | Takamatsu | ............... | H05B 6/70 219/756 |
| 2020/0312639 A1 | 10/2020 | Tom et al. | | |
| 2023/0207292 A1* | 6/2023 | Yang | ..................... | C23C 16/345 118/723 I |

FOREIGN PATENT DOCUMENTS

| | | | | |
|---|---|---|---|---|
| CN | 110718437 A * | 1/2020 | .......... | H01J 37/3244 |
| JP | 7-332165 | 12/1995 | | |

(Continued)

OTHER PUBLICATIONS

International Search Report issued Oct. 3, 2023 in International Application No. PCT/JP2023/027318.

*Primary Examiner* — Seokjin Kim
(74) *Attorney, Agent, or Firm* — Wenderoth, Lind & Ponack, L.L.P.

(57) ABSTRACT

A microwave plasma generating apparatus provided with a plurality of microwave plasma generating devices provided with a tubular container made of a dielectric material, a tubular chamber arranged to cover the tubular container, a gas supply port provided to an end of the tubular container, and a microwave introduction port provided at a side of the tubular chamber, has at another end of the tubular container a metallic tube that emits reactive gas generated by a reaction between the gas and the plasma, and is characterized in that an inner diameter of the metallic tube is equal to or larger than 0.1 mm and is equal to or smaller than a half of a wavelength of microwave to be used, and a ratio L2/R2
(Continued)

of an axial direction length L2 to the inner diameter R2 of the metallic tube is equal to or larger than 0.5.

17 Claims, 6 Drawing Sheets

(52) U.S. Cl.
CPC .. *H01J 37/32541* (2013.01); *H01J 37/32834* (2013.01); *H01J 2237/334* (2013.01)

(56) References Cited

FOREIGN PATENT DOCUMENTS

| | | | | | |
|---|---|---|---|---|---|
| JP | H07332165 | A | * | 12/1995 | |
| JP | 2022-525472 | | | 5/2022 | |
| JP | 7676795 | B2 | * | 5/2025 | .............. H10P 14/42 |
| WO | 03/096769 | | | 11/2003 | |

* cited by examiner

MICROWAVE PLASMA GENERATING APPARATUS, MICROWAVE PLASMA PROCESSING APPARATUS, AND MICROWAVE PLASMA PROCESSING METHOD

TECHNICAL FIELD

The present invention relates to a microwave plasma generating apparatus that generates plasma by use of microwave, a microwave plasma processing apparatus that uses the same, and a method for performing microwave plasma processing.

BACKGROUND

In semiconductor manufacturing processes, plasma processing is frequently used for etching processes, film forming processes, and the like of semiconductor substrates. As a plasma processing apparatus that performs such plasma processing, a microwave plasma processing apparatus capable of uniformly forming plasma with high density and low electron temperature is attracting attention.

A microwave plasma processing apparatus has a microwave excitation type plasma source that excites plasma by microwave having a wavelength of several hundreds of MHz to several tens of GHz, has a lower plasma voltage compared to high-frequency plasma sources, and therefore is widely used in damage-free resist ashing, anisotropic etching with bias voltage application, and the like.

To perform plasma processing on a large-area wafer, for example, a plasma generating source needs to be large. Patent literature 1 (Japanese patent publication No. H07-332165 A) discloses a plasma processing apparatus. In this plasma processing apparatus, a cylindrical container has an inner diameter that allows a large diameter wafer of 8 inches or more to be disposed, is made of a conductive material that allows microwave to propagate, and inside thereof is partitioned by disk-shaped microwave-transmitting member. A part inside the cylindrical container is set to a reduced-pressure atmosphere. A microwave waveguide is connected to another part inside the cylindrical container. A surface of the microwave-transmitting member at a side of the reduced-pressure atmosphere is located nearby a position within a distance of n/2 times a waveguide wavelength of the microwave from an end surface of the cylindrical container connected to the microwave waveguide. Patent literature 1 describes that this plasma processing apparatus can accommodate to a size enlargement for samples with diameters of 8 inches or more and can improve speed and uniformity of sample processing.

However, a plasma processing apparatus described in patent literature 1 needs to be provided with a plasma generating source that is capable of generating plasma with a high-frequency source having an enormous power. A plasma generating source driven by such an enormous power has a problem that energy efficiency is poor and therefore production efficiency is significantly reduced. In addition, as the power is enormous, electric field leakage is large and this may cause damage to processed substrates.

As a microwave plasma generating apparatus with a simple configuration, patent literature 2 (WO 03/096769 A 1) discloses a microwave plasma generating apparatus which is configured so that, by introducing microwave through a side of a cylindrical single-walled container made of a dielectric material, the cylindrical container forms a dielectric guide with an unlimited length and reflection of introduced microwave is suppressed, and therefore needs no impedance matcher. The cylindrical type microwave plasma generating apparatus described in patent literature 2 has a high plasma density, can shorten processing time and is inexpensive because of its simple structure.

Plasma processing a large-area wafer by use of the microwave plasma generating apparatus described in patent literature 2 can be accommodated by arranging a plurality of the microwave plasma generating apparatuses side by side. However, in such a configuration of arranging a plurality of plasma generating apparatuses side by side, interference occurs between a plurality of microwave generating apparatuses provided in each plasma generating apparatus and uniform plasma cannot be generated. In addition, microwave generated by a microwave generating source may destroy another microwave generating source.

CITED DOCUMENTS

Patent Literature

[Patent Literature 1] Japanese Patent Publication No. H07-332165 A
[Patent Literature 2] WO 03/096769 A1

SUMMARY

Therefore, an objective of the present invention is to provide a microwave plasma generating apparatus in which no microwave interference occurs between each plasma generating device, uniform plasma can be generated, and other microwave generating source is not destroyed. In addition, an objective of the present invention is to provide a microwave plasma processing apparatus that uses the same and a method to perform microwave plasma processing by using the microwave plasma processing apparatus and the like.

As a result of intensive research in view of the above objective, the present inventors found out that, by providing a tubular container made of a dielectric material with a metallic tube having an inner diameter equal to or smaller than an inner diameter of the tubular container at an end of the tubular container, microwave leakage into a workpiece to be processed is reduced, uniform plasma can be generated, and destruction of other microwave generating source can be prevented, and achieved the present invention.

That is, a microwave plasma generating apparatus according to the present invention is provided with a plurality of microwave plasma generating devices. Each microwave plasma generating device is provided with a tubular container made of a dielectric material, a tubular chamber arranged outside the tubular container to cover the tubular container, a gas supply port that is provided to an end of the tubular container and supplies gas into the tubular container, and a microwave introduction port provided at a side of the tubular chamber, and generates plasma along an inner surface of the tubular container. The microwave plasma generating apparatus has an emission part that is connected to another end of the tubular container and emits reactive gas generated by a reaction between the gas and the plasma. The emission part includes a conductive tube of which an inner diameter is reduced than the other end of the tubular container.

More specifically, the conductive tube of the emission part is made of a metallic tube connected to the other end of the tubular container and is characterized by satisfying any one of following conditions:

(1) an inner diameter of the metallic tube is equal to or larger than 0.1 mm and is equal to or smaller than a half of a wavelength of microwave to be used, and a ratio L2/R2 of an axial direction length L2 to the inner diameter R2 of the metallic tube is equal to or larger than 0.5;

(2) the inner diameter of the metallic tube is equal to or smaller than an inner diameter of the tubular container, and the ratio L2/R2 of the axial direction length L2 to the inner diameter R2 of the metallic tube is equal to or larger than 0.5; or (3) the inner diameter of the metallic tube is equal to or larger than 0.1 mm and is equal to or smaller than 65% of the inner diameter of the tubular container.

As the microwave plasma generating apparatus according to the present invention is capable of uniformly performing plasma process on a workpiece to be processed such as a large area substrate and has a small and simple unit configuration, the microwave plasma generating apparatus can utilize microwave energy with high efficiency. In addition, damage to the workpiece to be processed (such as the substrate) caused by plasma can be reduced. Therefore, the microwave plasma generating apparatus, the microwave plasma processing apparatus using the same, and the microwave plasma processing method according to the present invention is particularly suitable for etching process, film formation process, and the like on semiconductor substrates.

The microwave plasma processing apparatus according to the present invention is characterized in that it comprises the microwave plasma generating apparatus and a sample processing room connected to the microwave plasma generating apparatus and arranged to be supplied with the reactive gas generated in the microwave plasma generating apparatus.

The microwave plasma processing method according to the present invention is a method of processing the workpiece to be processed by use of the microwave plasma processing apparatus and is characterized in performing processing on the workpiece to be processed by supplying gas through the gas supply port provided to the tubular container of the microwave plasma generating apparatus provided with the plurality of microwave plasma generating devices, introducing microwave through the microwave introduction port provided on a side of the tubular chamber, generating plasma inside the tubular container, supplying reactive gas generated by a reaction between the gas and the plasma into the sample process room connected to the tubular container, exhausting the supplied gas and the reactive gas after processing through the gas exhaust port provided to the sample process room, and irradiating the workpiece to be processed held on the holding table in the sample process room with the reactive gas.

The microwave plasma processing method according to the present invention is a method of processing the workpiece to be processed by using a microwave plasma processing apparatus provided with a microwave plasma generating apparatus provided with a plurality of microwave plasma generating devices. The microwave plasma generating device has a tubular container made of a dielectric material, a tubular chamber arranged to cover the tubular container from outside, a gas supply port provided at an end of the tubular container to supply gas into the tubular container, and a microwave introduction port provided on a side of the tubular chamber. An emission part, that is connected to another end of the tubular container and emits reactive gas generated by a reaction between the gas and the plasma, includes a conductive tube of which an inner diameter is reduced than the other end of the tubular container. The method includes supplying the gas through the gas supply port provided to the tubular container of the microwave plasma generating apparatus provided with the plurality of microwave plasma generating devices, introducing microwave through the microwave introduction port provided on the side of the tubular chamber, generating the plasma inside the tubular container, and exhausting the reactive gas from the tubular container.

DETAILED DESCRIPTION

[1] Microwave Plasma Processing Apparatus

Figure 1:
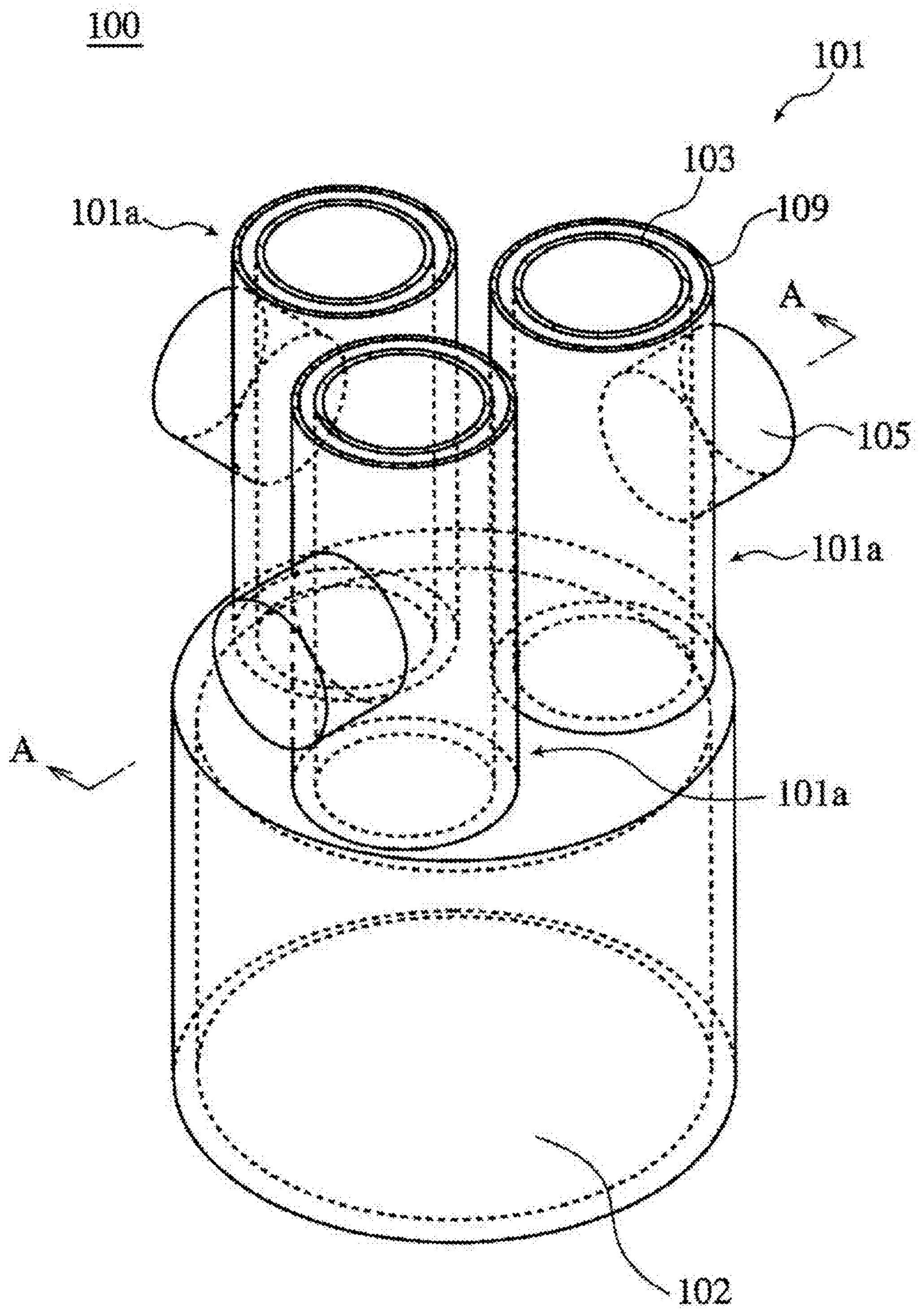
FIG. 1 is a perspective view schematically showing an example of a microwave plasma processing apparatus according to the present invention.
Figure 2A:
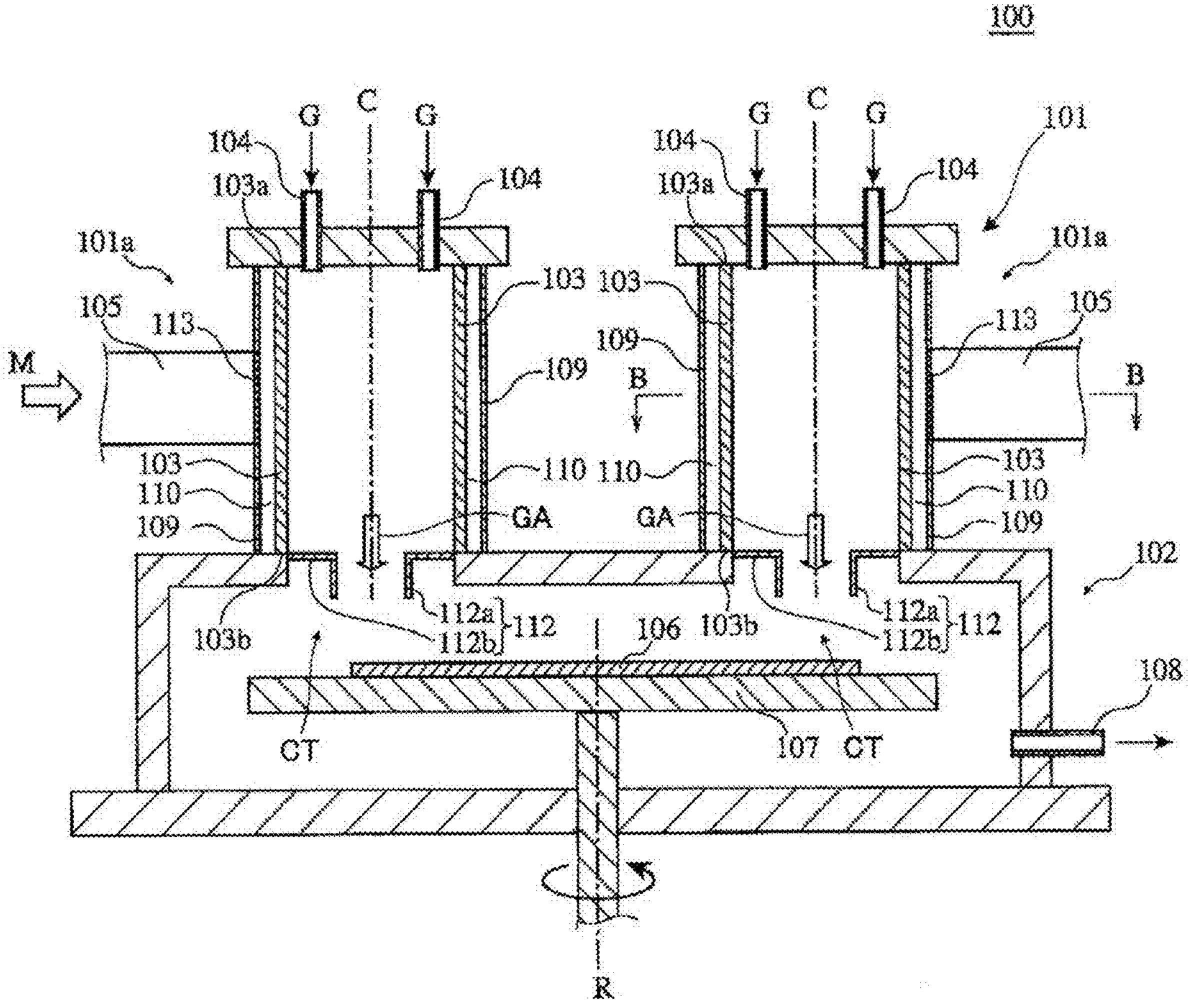
FIG. 2*a* is an A-A cross-sectional view of the microwave plasma processing apparatus in FIG. 1.
Figure 2B:
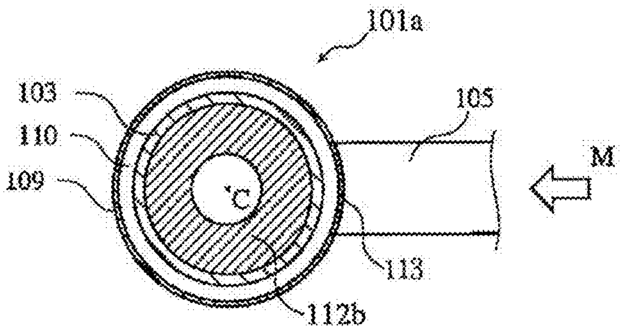
FIG. 2*b* is a B-B cross-sectional view of FIG. 2*a*.

FIG. 1, FIG. 2*a* and FIG. 2*b* show an example of a microwave plasma processing apparatus 100 according to the present invention that consists of a microwave plasma generating apparatus 101 according to the present invention and a sample process room 102 that is connected to the microwave plasma generating apparatus 101 and arranged to be supplied with the reactive gas GA generated in the microwave plasma generating apparatus 101. It should be noted that FIG. 1 shows the microwave plasma generating device 101*a* with only a tubular container 103, a tubular chamber 109, and a microwave introduction port 105 and without a holding table 107 and the like in the sample process room 102 that are omitted.

Figure 3:
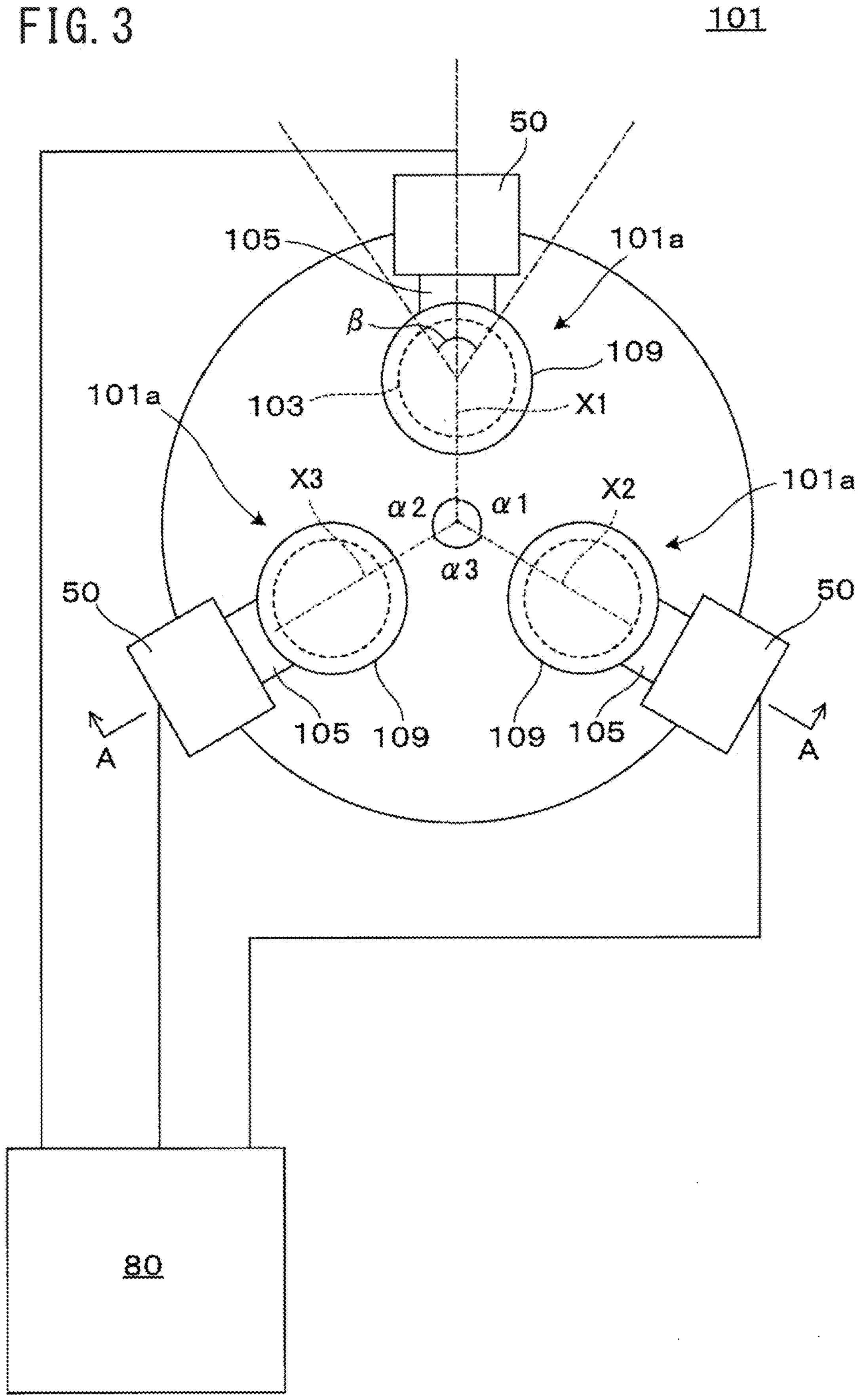
FIG. 3 is a plan-view of the microwave plasma processing apparatus in FIG. 1.

FIG. 3 is a plan view showing the microwave plasma generating apparatus 101 shown in FIG. 1 and the like, including a magnetron 50 and the like associated with the microwave plasma generating device 101*a*.

(1) Microwave Plasma Generating Apparatus

The microwave plasma generating apparatus 101 is provided with a plurality of microwave plasma generating devices 101*a* (three in FIG. 1), each of which generates plasma along an inner surface of the tubular container 103 by using microwave. The microwave plasma generating device 101*a* is provided with a tubular container 103 made of a dielectric material, a tubular chamber 109 arranged outside the tubular container 103 to cover the tubular container 103, a gas supply port 104 which is provided at an end 103*a* of the tubular container 103 and supplies gas into the tubular container 103, and a microwave introduction port 105 provided at a side of the tubular chamber 109. The microwave plasma generating apparatus 101 has, at another end 103*b* of the tubular container 103, an emission part 112 for emitting reactive gas GA generated by a reaction between the gas G and the plasma. The emission part 112 is made of a metallic tube 112*a* connected to the other end 103*b* of the tubular container 103 and is characterized in satisfying any one of following conditions: (i) an inner diameter R2 of the metallic tube 112*a* is equal to or larger than 0.1 mm and is equal to or less than a half of wavelength of the used microwave or equal to or less than an inner diameter of the tubular container 103, and a ratio L2/R2 of an axial direction length L2 and the inner diameter R2 of the metallic tube 112*a* is equal to or larger than 0.5, or (ii) the inner diameter R2 of the metallic tube 112*a* is equal to or larger than 0.1 mm and is equal to or less than 65% of the inner diameter of the tubular container 103.

As shown in FIG. 3, a magnetron 50 is connected to the microwave introduction port 105 of each microwave plasma generating device 101*a*. The magnetrons 50 are driven under control of a power control device 80. Reference axes X1 to X3, on which the chambers 109 or the containers 103 are arranged, are evenly arranged around the center C of the microwave plasma generating apparatus 101, angles $\alpha 1$ to $\alpha 3$ are equal, and distances from the center C to the containers 103 are also equal. Although in the illustrated example directions along which the microwave introduction ports 105 extend from the containers 103 are parallel to the reference axes X1 to X3, the directions along which the microwave introduction ports 105 extend may be within a predetermined angle range $\beta$ in a plan view with respect to the reference axes X1 to X3, from a viewpoint of ensuring sufficient space for arranging magnetrons 50 by avoiding interference. Herein, the angle range $\beta$ is for example set to 360°/n, preferably to 360°/2n, when n is a number of the microwave plasma generating devices 101*a* evenly arranged around the center C, while this is not limitative.

When supplying the tubular container 103 kept in a decompression state with the gas G (hydrogen gas for example) through the gas supply port 104 and introducing microwave M into the microwave plasma generating device 101*a* through the microwave introduction port 105 provided at a side of the tubular chamber 109, the microwave generates standing waves with a surface of the tubular container 103 as a transmission path, and plasma of the gas G is generated in the tubular container 103 by the microwave which penetrates into the tubular container 103. The generated plasma and/or reactive gas GA (plasma, radicals and the like of the gas G) generated by a reaction with the plasma is emitted through the metallic tube 112*a* of the emission part 112 provided at the other end 103*b* along a flow of the supplied gas G and is/are introduced into a sample process room 102 connected thereto. Herein, the metallic tube 112*a* is a conductive tube CT of which an inner diameter is reduced than the other end 103*b* of the tubular container 103. That is, when the tubular container 103 has a perfectly circular shape, the inner diameter of the conductive tube CT that is the metallic 112*a* is smaller than the inner diameter of the other end 103*b*. In addition, the axial direction length of the conductive tube CT is equal to or longer than a half of the inner diameter of the metallic tube 112*a*.

(a) Overall Configuration

As shown in FIG. 2*a*, the microwave plasma generating device 101*a* is arranged so that the emission part 112 provided to the other end 103*b* faces a workpiece to be processed 106 in the sample process room 102 at a boundary surface between the microwave plasma generating apparatus 101 and the sample process room 102. Although in the drawing each microwave plasma generating device 101*a* is arranged so that the axial direction of the tubular container 103 is perpendicular to the boundary surface, each microwave plasma generating device 101*a* does not necessarily have to be arranged in this way, and may be arranged with an inclination within a range equal to or larger than 30° and less than 90° to a reference direction parallel to the boundary surface. Inclination angle of each microwave plasma generating device 101*a* may be same or different. By arranging the microwave plasma generating devices 101*a* with inclinations in this manner, as a shape of the reactive gas expands in the inclined direction when the reactive gas is radiated onto the workpiece to be processed 106 arranged in the sample process room 102, the reactive gas can be radiated over a wider area.

The axial direction of the tubular containers 103 of the plurality of microwave plasma generating devices 101*a* may be parallel to each other or not. In particular, in case of arranging the microwave plasma generating devices 101*a* with inclinations with respect to the boundary surface, it is preferable to arrange the same so that inclined direction of each microwave plasma generating device 101*a* differs even if inclination angle thereof is the same, or so that inclination angle of each microwave plasma generating device 101*a* differs and the inclined direction thereof is dispersed. In addition, although in FIG. 2*a* the tubular container 103 and the tubular chamber 109 portion are configured to be connected to the sample process room 102, an aperture part of the metallic tube 112*a* may be configured to be connected to the sample process room 102.

Each microwave plasma generating device 101*a* may have a same configuration or a different configuration, for example a configuration with difference in inner diameter, wall thickness or length of the tubular container 103, position of the microwave introduction port 105, an output power of the microwave generating device (in particular the magnetron 50), a shape of the emission part 112, the diameter or the length of the metallic tube 112*a*, and the like. In addition, the number of the microwave plasma generating devices 101*a* is not limited in particular and may be two or more. Although no upper limit is specified, the number of the microwave plasma generating device 101*a* per unit of 100 $cm^2$ of process area is preferably ten or less, more preferably five or less, even more preferably two or less.

Figure 4A:
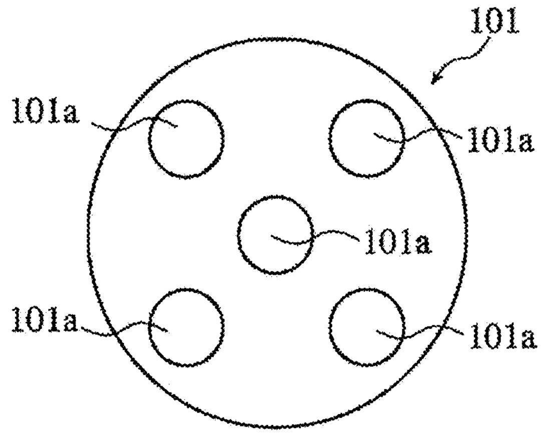
FIG. 4*a* is a schematic diagram showing an example of a plurality of microwave plasma generating devices arranged in a microwave plasma generating apparatus according to the present invention in axial direction.
Figure 4B:
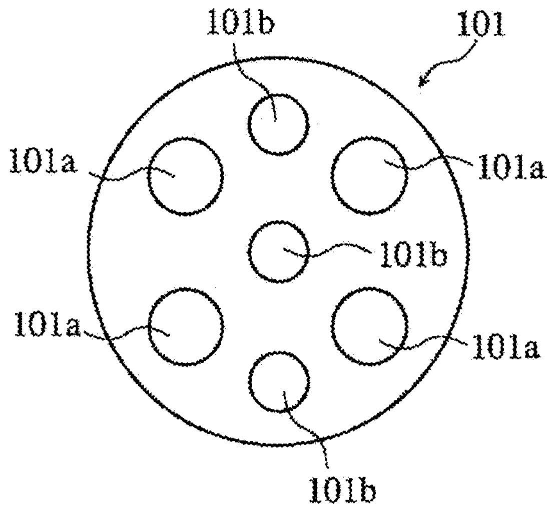
FIG. 4*b* is a schematic diagram showing another example of the plurality of microwave plasma generating devices arranged in the microwave plasma generating apparatus according to the present invention in the axial direction.
Figure 4C:
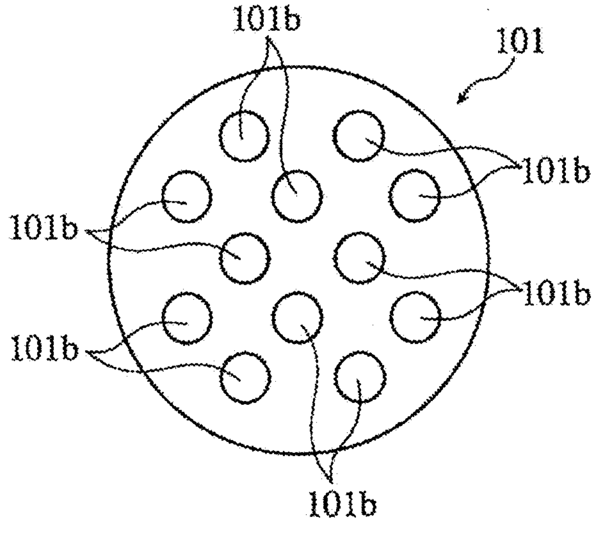
FIG. 4*c* is a schematic diagram showing yet another example of the plurality of microwave plasma generating devices arranged in the microwave plasma generating apparatus according to the present invention in the axial direction.

FIG. 4*a* to FIG. 4*c* schematically show the plurality of microwave plasma generating devices 101*a*, 101*b* arranged to the microwave plasma generating apparatus 101 in axial direction. In FIG. 4*a* to FIG. 4*c*, each of the microwave plasma generating devices 101*a*, 101*b* is simply shown as a circle. FIG. 4*a* shows a configuration in which four microwave plasma generating devices 101*a* with a same diameter (large diameter) are arranged; FIG. 4*b* shows a configuration in which four microwave plasma generating devices 101*a* with a large diameter and three microwave plasma generating devices 101*b* with a small diameter are arranged; and FIG. 4*c* shows a configuration in which twelve microwave plasma generating devices 101*b* with a same diameter (small diameter) are arranged.

As shown in above examples, by arranging a plurality of microwave plasma generating devices side by side, it becomes possible to uniformly radiate generated plasma onto the workpiece to be processed over a wide area. Arrangement pattern of the plurality of microwave plasma generating devices arranged to the microwave plasma generating apparatus 101 is not limited to those examples, and the arrangement may be made so that generated plasma can be uniformly radiated onto the workpiece to be processed.

(b) Configuration of Emission Part

The emission part 112 is made of the metallic tube 112*a* connected to the other end 103*b* of the tubular container 103. The inner diameter of the conductor tube CT that is the metallic tube 112*a* is smaller than the inner diameter of the other end 103*b* of the tubular container 103. More specifically, the inner diameter R2 of the metallic tube 112*a* satisfies any one of the following conditions:

(i) the inner diameter R2 of the metallic tube 112*a* is equal to or larger than 0.1 mm and equal to or less than the half of the wavelength of the used microwave or equal to or less than the inner diameter of the tubular container 103, and the ratio L2/R2 of the axial direction length L2 and the inner diameter R2 of the metallic tube 112*a* is equal to or larger than 0.5; or (ii) the inner diameter R2 of the metallic tube 112*a* is equal to or larger than 0.1 mm and equal to or less than 65% of the inner diameter of the tubular container 103.

In connection with the condition (i), the inner diameter R2 of the metallic tube 112*a* is equal to or larger than 0.1 mm and equal to or less than the half of the wavelength of the used microwave or equal to or less than the inner diameter of the tubular container 103. For example, when microwave with a frequency of 2.45 GHz (wavelength=approximatively 122 mm) is used, the inner diameter R2 of the metallic tube 112*a* is set to be equal to or less than 61 mm. When the inner diameter of the tubular container 103 is larger than the half of the wavelength of the used microwave, the upper limit of the inner diameter R2 of the metallic tube 112*a* is set to the inner diameter of the tubular container 103. In addition, the ratio L2/R2 of the axial direction length L2 and the inner diameter R2 of the metallic tube 112*a* is equal to or larger than 0.5. By adopting such configuration, microwave interference between each plasma generating devices does not occur, uniform plasma can be generated, and destruction of other microwave generating sources can be prevented. The ratio L2/R2 is more preferably equal to or larger than 1, even more preferably equal to or larger than 1.5, and most preferably equal to or larger than 2.

When the ratio L2/R2 is equal to or larger than 0.5, the inner diameter R2 of the metallic tube 112*a* is preferably 2 to 100%, more preferably 10 to 90%, even more preferably 20 to 80%, even more preferably 30 to 70% of the inner diameter of the tubular container 103. In particular, when the condition (ii) described below is considered, it is preferable that the inner diameter R2 of the metallic tube 112*a* is larger than 65% of the inner diameter of the tubular container 103. In addition, the axial direction length L1 of the tubular container 103 is preferably 4 to 1000%, more preferably 20 to 500%, even more preferably 40 to 300%, most preferably 60 to 200% of an inner diameter R1 of the tubular container 103.

In connection with the condition (ii), the inner diameter R2 of the metallic tube 112*a* is, regardless a value of the above-described ratio L2/R2, equal to or larger than 0.1 mm and equal to or less than 65% of the inner diameter of the tubular container 103. By adopting such configuration, microwave interference between each plasma generating device does not occur, uniform plasma can be generated, and destruction of other microwave generating sources can be prevented. The inner diameter R2 of the metallic tube 112*a* is preferably equal to or less than 60%, more preferably equal to or less than 55%, most preferably equal to or less than 50% of the inner diameter of the tubular container 103. In addition, a lower limit of the inner diameter R2 of the metallic tube 112*a* is preferably 2%, more preferably 10%, even more preferably 20%, most preferably 30% of the inner diameter or the tubular container 103.

It is sufficient that any one of the above conditions (i) and (ii) is satisfied; however, both conditions may be satisfied of course.

When the inner diameter R2 of the metallic tube 112*a* is smaller than the inner diameter R1 of the tubular container 103, the metallic tube 112*a* is connected to the other end 103*b* of the tubular container 103 via a connection member 112*b*. The connection member 112*b* covers the other end 103*b* of the tubular container 103 and has a hole, to which the metallic tube 112*a* is connected, at a center part thereof. The connection member 112*b* preferably has a disc shape or a tapered shape.

The metallic tube 112*a* is preferably made of at least a kind selected from a group consisting of stainless steel, aluminum, and aluminum alloy.

(c) Tubular Container

The tubular container 103 is preferably made of a material having excellent corrosion resistance against plasma, and it is preferably made of quarts glass (relative dielectric constant: 3.9), alumina (relative dielectric constant: 9.0), boron nitride (relative dielectric constant:14), or aluminum nitride (relative dielectric constant:8.5), for example.

The tubular container preferably has an inner diameter of 10 to 300 mm and a thickness of 1 to 100 mm, more preferably has an inner diameter of 20 to 100 mm and a thickness of 10 to 50 mm, most preferably has an inner diameter of 30 to 80 mm and a thickness of 15 to 30 mm. The present invention is suitable for such a relatively small microwave plasma generating device.

(d) Tubular Chamber

The tubular chamber is preferably made of at least one kind selected from a group consisting of stainless steel, aluminum, aluminum alloy, and the like.

(e) Others

Although a gap 110 between the tubular container 103 and the tubular chamber 109 may be an empty space (vacuum), it is preferably filled with a dielectric material. The dielectric material includes air. By filling the gap 110 with a dielectric material, reflection of microwave at an interface between the tubular container 103 and outside air or the like is suppressed, the microwave is sufficiently transmitted to inside the tubular container 103, plasma generation efficiency is improved, and a processing efficiency can be improved as a result.

At the microwave introduction port 105 of the microwave plasma generating apparatus 101, as microwave is almost perpendicularly irradiated to the dielectric material 110 and the tubular container 103 and then reflected, the microwave utilization efficiency decreases. In order to prevent such a decrease of utilization efficiency, it is preferable to provide a microwave anti-reflection structure 113 at a portion where the microwave introduction port 105 is connected to the tubular chamber 109. As the anti-reflection structure 113, for example, a structure having a large number of nano-level minute protrusions are arranged at regular intervals, a so-called moth-eye structure, may be used.

In addition, a layer of low permittivity material may be provided thereto.

(2) Sample Process Room

The sample process room 102 is connected to the microwave plasma generating apparatus 101 and arranged to be supplied with the reactive gas GA generated in each microwave plasma generating device 101*a*. The sample process room 102 is provided with a holding table 107 for holding the workpiece to be processed 106 arranged so that the reactive gas GA generated in the microwave plasma generating apparatus 101 is irradiated onto the workpiece to be processed 106, and a gas exhaust port 108 which exhausts the supplied gas G and the reactive gas GA after processing. The holding table 107 is provided rotatable around a predetermined rotation axis R. The rotation axis R and the center C of the tubular container 103 may be arranged inclined with a predetermined angle. The holding table 107 is preferably provided with a temperature control function.

Although a position where the gas exhaust port 108 is provided is not particularly limited, it is preferably downstream of the holding table 107, that is, behind the holding table 107 when viewed from the microwave plasma generating apparatus 101. In particular, it is preferably provided on a side of the holding table 107 opposite to a side where the workpiece to be processed 106 is placed.

An inner surface of the process room is preferably subjected to a hard alumite treatment to prevent corrosion due to the reactive gas.

[2] Microwave Plasma Processing Method

The microwave plasma processing method according to the present invention is performed by using the above-described microwave plasma processing apparatus 100 (for example, the apparatus shown in FIG. 1, FIG. 2*a*, and FIG. 2*b*) provided with the microwave plasma generating apparatus 101 and the sample processing room 102 connected thereto. That is, the microwave plasma processing method according to the present invention is characterized in performing process to the workpiece to be processed 106 by: supplying the gas G through the gas supply port 104 provided to the tubular container 103 of the microwave plasma generating apparatus 101 provided with the plurality of microwave plasma generating devices 101*a*; introducing the microwave M through the microwave introduction port 105 provided at a side of the tubular chamber 109; generating the plasma inside the tubular container 103; supplying the sample processing room 102 connected to the tubular container 103 with the reactive gas GA generated by the reaction between the gas G and the plasma; exhausting the supplied gas G and the reactive gas GA after processing through the exhaust port 108 provided to the sample processing room 102; and irradiating the reactive GA onto the workpiece to be processed 106 held on the holding table 107 in the sample processing room 102.

The microwave plasma process is performed, for example, by: supplying the tubular container 103 kept at a pressure equal to or less than 1 Torr with the gas G (for example, hydrogen gas) through the gas supply port 104 by a flow rate of 0.1 to 10 sccm (standard cubic centimeter per minute); introducing the microwave M of an output power of 100 to 2000 W (for example, 2450 MHz and 800 W) through the microwave introduction port 105; generating a tubular reactive gas GA inside the tubular container 103 by the microwave made to a standing wave state in the tubular container 103; and irradiating the reactive gas GA including radicals of which a density is equal to or larger than $5\times10^{14}$ unit/$cm^3$ onto the workpiece to be processed 106 kept at 0 to 400° C. by rotating the holding table 107 during 1 to 20 minutes. As a result, a product of irradiation time and density of the radicals on the workpiece to be processed 106 can be equal to or larger than $25\times10^{14}$ minutes unit/$cm^3$. Potential difference between the reactive gas GA and a surface of the workpiece to be processed 106 is preferably equal to or less than 10V. The reactive gas GA after processing and surplus gas G are exhausted through the gas exhaust port 108. It should be noted that an irradiation density of the radicals can be determined by a known method (T. Arai et al., (2016) "Selective Heating of Transition Metal Usings Hydrogen Plasma and Its Application to Formation of Nickel Silicide Electrodes for Silicon Ultralarge-Scale Integration Devices" Journal of Materials Science and Chemical Engineering, 2016, 4, 29-33.).

In the above description, the microwave M introduced through the microwave introduction port 105 may be supplied continuously or in a pulsed manner. In case of supplying the microwave M in a pulsed manner, the microwave M can be sequentially supplied to three tubular containers 103 with a predetermined time difference, and in this case, the pulses that are sequentially supplied with a predetermine time difference may or may not overlap in time with each other.

Specific processes performed by the microwave plasma processing apparatus 100 include film forming, etching, and ashing. For example, in case of forming $SiO_2$ film or in case of ashing a resist, oxygen gas is used as processing gas G from a viewpoint of generating oxygen radicals for example. Depending on a purpose of processing, gases other than oxygen such as nitrogen, hydrogen, carbon dioxide, ammonia, rare gases (helium, neon, argon, and the like), and the like can be used as the processing gas G. For example, in case of etching Si, $CF_4$ and $CF_6$ are used to generate fluorine radicals.

Inside the tubular container, or inside the tubular container and inside the tubular chamber is/are preferably kept at a pressure equal to or less than 10 Torr, more preferably kept at a pressure between 1 mTorr and 10 Torr, and most preferably kept at a pressure between 10 mTorr and 1 Torr.

Gas supply rate is preferably 0.01 to 1000 sccm, more preferably 0.1 to 500 sccm, and most preferably 0.5 to 5 sccm. If the gas supply rate is less than 0.01 sccm, a reactive gas concentration does not increase, and if the gas supply rate is larger than 100 sccm, exhausting rate is not sufficient and the pressure becomes unstable.

Gas exhaust rate is preferably 1 to 10000 L/minute (litter per minute), more preferably 10 to 2000 L/minute, and even more preferably 50 to 1000 L/minute. If the gas exhaust rate is less than 1 L/minute, exhausting takes too long, and if the gas exhaust rate is larger than 10000 L/minute, it is too costly.

Microwave output power is preferably 10 to 10000 W, more preferably 100 to 1000 W, most preferably 200 to 700 W. If the microwave output power is less than 10 W, reactive gas generation becomes too small, and if the microwave output power is larger than 10000 W, it is too costly.

Processing time is preferably 0.001 to 100 minutes, more preferably 0.01 to 50 minutes, even more preferably 0.05 to 20 minutes. If the processing time is shorter than 0.001 minutes, effect becomes too small, and if the processing time is longer than 100 minutes, productivity declines.

Rotation speed of the holding table is preferably 0.1 to 10000 rpm, more preferably 1 to 1000 rpm, and even more preferably 10 to 200 rpm. If the rotation speed is slower than 0.1 rpm, unevenness occurs, and if the rotation speed is faster than 10000 rpm, mechanical durability decreases.

Exemplary Embodiments

Although the present invention will be described in more detail in following exemplary embodiments, the present invention is not limited thereto.

[Exemplary embodiment 1] As shown in FIG. 1, a model of a microwave plasma processing apparatus provided with a microwave plasma generating apparatus having three microwave plasma generating devices has been constructed, and an amount of electromagnetic wave leakage to a workpiece to be processed arranged in a sample processing room has been calculated. A configuration of the microwave plasma generating apparatus is as follows.

Microwave Plasma Generating Device (all Three Devices have a Same Shape);

<Tubular Container>

Material: quartz glass, outer diameter: 50 mm, inner diameter: 46 mm; axial direction length: 200 mm.

<Tubular Chamber>

Material: stainless steel; outer diameter: 100 mm, inner diameter: 80 mm; axial direction length: 250 mm.

<Metallic Tube>

Material: stainless steel; inner diameter and axial direction length: described in Table 1.

<Arrangement of Microwave Plasma Generating Devices>

Distance between centers: 120 mm (arrangement at vertexes of an equilateral triangle with sides of 120 mm)

Process Conditions:

Distance from the metallic tube to the workpiece to be processed: 50 mm.

Pressure in the tubular chamber: 200 mTorr.

Gas: hydrogen; gas flow rate: 10 sccm.

Microwave frequency: 2.45 GHz (wavelength; approximatively 122 mm); output power: 500 W.

Figure 5:
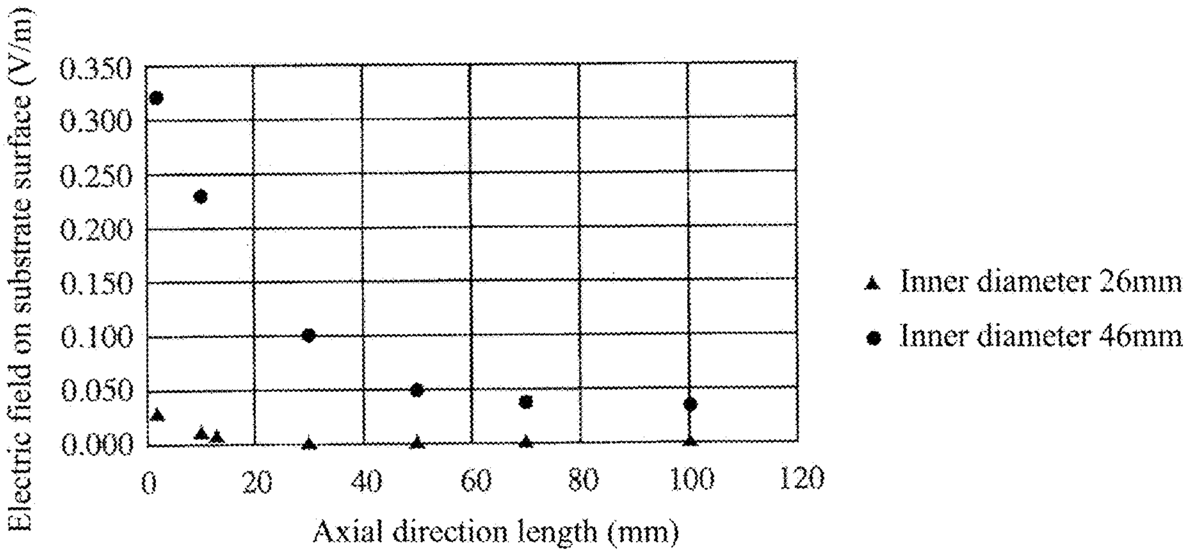
FIG. 5 is a graph showing electric filed on a surface of a workpiece to be processed when an inner diameter and an axial direction length of a metallic tube are changed in the microwave plasma processing apparatus according to the present invention.

By using this model and by changing the inner diameter and the axial direction length of the metallic tube as shown in Table 1, the electric field on the surface of the workpiece to be processed has been calculated. A result is shown in Table 1 and FIG. 5.

TABLE 1

| | Metallic tube | | | Electrid field on substrate surface | |
|---|---|---|---|---|---|
| Sample No. | Inner diameter (R2) | Axial direction length (L2) | L2/R2 | dBV/m | V/m |
| Sample 1 (Present invention) | 26 mm | 2 mm | 0.08 | −30.9 | 0.02851 |
| Sample 2 (Present invention) | 26 mm | 10 mm | 0.38 | −39.9 | 0.01012 |
| Sample 3 (Present invention) | 26 mm | 13 mm | 0.50 | −44.5 | 0.0080 |
| Sample 4 (Present invention) | 26 mm | 30 mm | 1.15 | −62.2 | 0.00078 |
| Sample 5 (Present invention) | 26 mm | 50 mm | 1.92 | −81.8 | 0.00008 |
| Sample 6 (Present invention) | 26 mm | 70 mm | 2.69 | −88.7 | 0.00004 |
| Sample 7 (Present invention) | 26 mm | 100 mm | 3.85 | −91.5 | 0.00003 |
| Sample 8 (Comparison example) | 46 mm | 2 mm | 0.04 | −9.9 | 0.32094 |
| Sample 9 (Comparison example) | 46 mm | 10 mm | 0.22 | −12.7 | 0.23049 |
| Sample 10 (Present invention) | 46 mm | 30 mm | 0.65 | −19.9 | 0.10150 |
| Sample 11 (Present invention) | 46 mm | 50 mm | 1.09 | −26.1 | 0.04936 |
| Sample 12 (Present invention) | 46 mm | 70 mm | 1.52 | −28.3 | 0.03830 |
| Sample 13 (Present invention) | 46 mm | 100 mm | 2.17 | −29.2 | 0.03455 |

As it is clear from Table 1. (i-1) when the inner diameter of the metallic tube is equal to or less than a half of the wavelength of the used microwave (122 mm) and the ratio L2/R2 of the axial direction length L2 and the inner diameter R2 of the metallic tube is equal to or larger than 0.5, (i-2) when the inner diameter of the metallic tube is equal to or less than the inner diameter of the tubular container and the ratio L2/R2 of the axial direction length L2 and the inner diameter R2 of the metallic tube is equal to or larger than 0.5, or (ii) when the inner diameter R2 of the metallic tube is equal to or larger than 0.1 mm and equal to or less than 65% of the inner diameter of the tubular container, the electric field on the substrate surface significantly decreased. Therefore, it is expected that no microwave interference between each plasma generating device occurs, uniform plasma can be generated, and no destruction of other microwave generating source occurs.

Although the present invention has been described above based on an embodiment, the present invention is not limited to the above embodiment.

Figure 6:
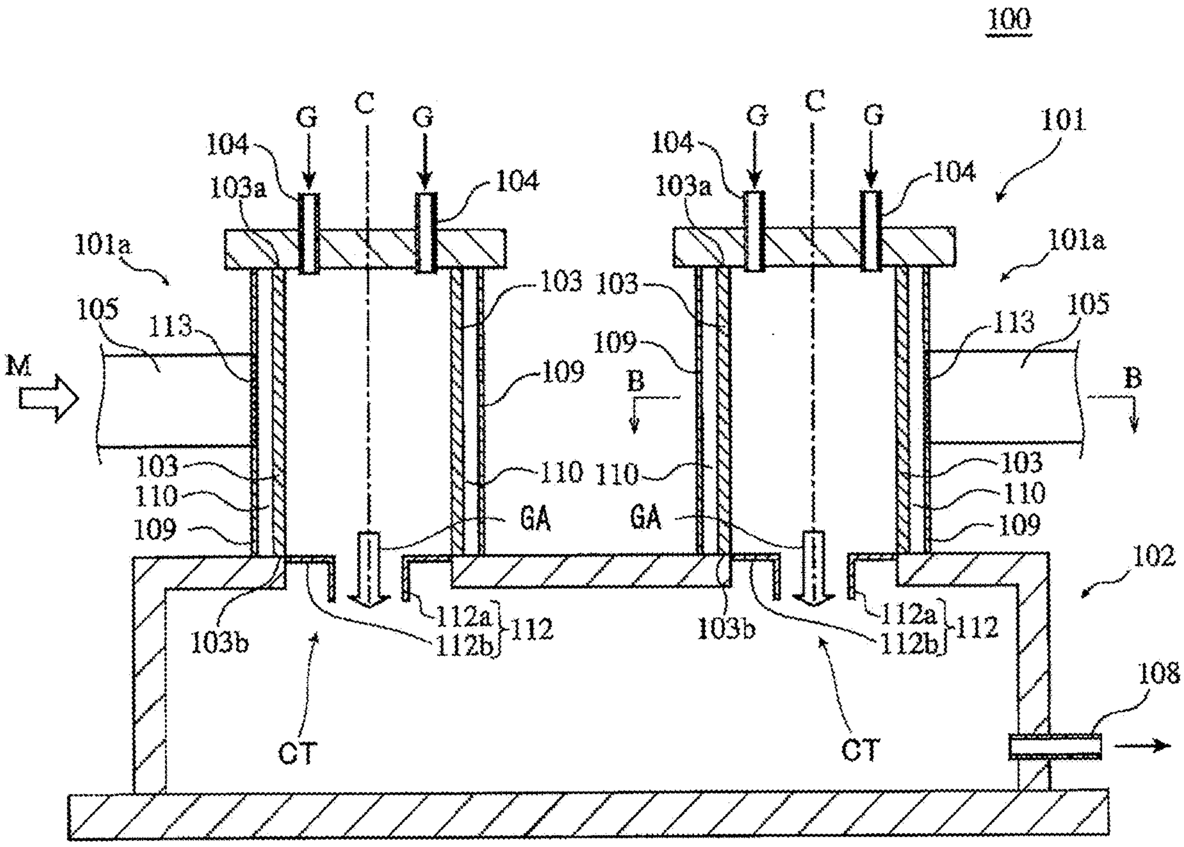
FIG. 6 It is a cross-sectional view for describing a variation example of the microwave plasma processing apparatus.

The microwave plasma processing apparatus is not limited to perform processes of film forming, etching, and ashing, and may perform reduction and other reactive phenomenon to target gases. In case of a microwave plasma processing apparatus 100 shown in FIG. 6, some kind of medium such as a reduction catalyst is arranged in the sample processing room 102 instead of a holding table 107 and a workpiece to be processed 106. In addition, the gas exhaust port 108 serves as a port for retrieving reductant gas and other processed gases. The gas to be processed, which is supplied to each container 103 in a reduced pressure state, is for example carbon dioxide gas, is turned into a plasma state by microwave, and is converted into carbon monoxide, which is a reduced substance. However, since the gas to be processed undergoes a reduction reaction due to hydrogen radicals, gas added with hydrogen gas at a predetermined ratio to carbon dioxide gas is used. That is, the gas G supplied to each container 103 is hydrogen gas mixed with carbon dioxide gas, a supply amount of hydrogen gas is usually 1 to 100 sccm, and a supply amount of carbon dioxide gas is usually 1 to 100 sccm. An amount of supplied hydrogen gas is preferably 1 to 100 times an amount of supplied carbon dioxide gas, and is more preferably 1 to 10 times the amount of supplied of carbon dioxide gas. Reduction catalysts including one kind, two kinds or more among metal elements in the fourth period or later of the periodic table, specifically, titanium, vanadium, chromium, iron, cobalt, nickel, copper, zinc, gallium, zirconium, molybdenum, ruthenium, palladium, tantalum, tungsten, platinum, gadolinium, and the like, can be used. The reduction catalyst is maintained at a temperature equal to or higher than 200° C. and equal to or lower than 800° C. for example by use of a non-illustrated heater during the reduction reaction.

The microwave plasma processing apparatus 100 may be one which causes reduction reaction without using any reduction catalyst. In this case, the sample processing room 102 is for retrieving at once carbon monoxide gas exhausted from each container 103. The sample processing room 102 may be provided with a separation membrane which separates carbon monoxide gas from oxygen generated at same time. As such a separation membrane, a porous material (refer to: https://www.jst.go.jp/pr/announce/20131213-2/index.html) may be used. Each container 103 which causes the reduction reaction has for example an inner diameter of 10 to 200 mm, preferably has an inner diameter of 20 to 100 mm, and more preferably has an inner diameter of 30 to 80 mm. A ratio L1/R1 of an axial direction length L1 with respect to an inner diameter R1 of each container 103 is equal to or larger than 0.5, and is preferably equal to or larger than 2. A pressure in each container 103 is usually 0.01 to 1000 Pa, preferably 0.1 to 200 Pa, and even more preferably 1 to 50 Pa.

The microwave plasma processing apparatus can be utilized as an apparatus for performing, when bonding dissimilar materials, activation or other preprocesses on a surface of bonding target in order to treat the surface of the bonding target.

It should be noted that the present application claims priority based on Japanese patent application 2022-119771 filed on Jul. 27, 2022, and herein incorporates all disclosure thereof by reference.

The invention claimed is:

1. A microwave plasma generating apparatus comprising:

a plurality of microwave plasma generating devices configured to generate plasma along an internal surface of a tubular container, each of the plurality of the microwave plasma generating device comprising:

the tubular container made of a dielectric material;

a tubular chamber arranged outside the tubular container to cover the tubular container;

a gas supply port, provided at an end of the tubular container, configured to supply gas into the tubular container; and a microwave introduction port provided at a side of the tubular chamber, the microwave plasma generating apparatus having an emission part, connected to another end of the tubular container, configured to emit reactive gas generated by a reaction between the gas and the plasma, wherein the emission part includes a conductive tube of which an inner diameter is reduced than the another end of the tubular container.

2. The microwave plasma generating apparatus according to claim 1, the conductive tube of the emission part is made of a metallic tube connected to the another end of the tubular container and satisfies any one of following conditions:

(1) an inner diameter of the metallic tube is equal to or larger than 0.1 mm and is equal to or smaller than a half of a wavelength of microwave to be used, and a ratio L2/R2 of an axial direction length L2 to the inner diameter R2 of the metallic tube is equal to or larger than 0.5;

(2) the inner diameter of the metallic tube is equal to or smaller than an inner diameter of the tubular container, and the ratio L2/R2 of the axial direction length L2 to the inner diameter R2 of the metallic tube is equal to or larger than 0.5; or (3) the inner diameter of the metallic tube is equal to or larger than 0.1 mm and is equal to or smaller than 65% of the inner diameter of the tubular container.

3. The microwave plasma generating apparatus according to claim 2, wherein the metallic tube is connected to the another end of the tubular container through a connection member.

4. The microwave plasma generating apparatus according to claim 3, wherein the connection member is configured to cover the another end of the tubular container and has a hole, to which the metallic tube is connected, at a center part of the connection member.

5. The microwave plasma generating apparatus according to claim 4, wherein the connection member has a disc shape or a tapered shape.

6. The microwave plasma generating apparatus according to claim 1, wherein the tubular container has an inner diameter equal to or larger than 10 mm and equal to or smaller than 300 mm and a thickness equal to or larger than 1 mm and equal to or smaller than 100 mm.

7. The microwave plasma generating apparatus according to claim 2, wherein the metallic tube is made of at least one kind selected from a group consisting of stainless steel, aluminum, and aluminum alloy.

8. The microwave plasma generating apparatus according to claim 1, wherein the tubular chamber is made of at least one kind selected from a group consisting of stainless steel, aluminum, and aluminum alloy.

9. A microwave plasma processing apparatus comprising:

the microwave plasma generating apparatus according to claim 1; and a sample processing room connected to the microwave plasma generating apparatus and arranged to be supplied with the reactive gas generated in the microwave plasma generating apparatus.

10. The microwave plasma processing apparatus according to claim 9, wherein the sample processing room comprises:

a holding table configured to hold a workpiece to be processed arranged to be irradiated with the reactive gas; and a gas exhaust port configured to exhaust the gas which is supplied and the reactive gas after processing.

11. A microwave plasma processing method for processing a workpiece to be processed by using a microwave plasma processing apparatus comprising:

a microwave plasma generating apparatus comprising a plurality of microwave plasma generating devices; and a sample processing room connected to the microwave plasma generating apparatus and arranged to be supplied with reactive gas generated in the microwave plasma generating apparatus, wherein each of the plurality of the microwave plasma generating device has:

a tubular container made of a dielectric material;

a tubular chamber arranged to cover the tubular container from outside;

a gas supply port, provided at an end of the tubular container, configured to supply gas into the tubular container; and a microwave introduction port provided at a side of the tubular chamber, wherein the sample processing room comprises:

a holding table; and a gas exhaust port, wherein an emission part, that is connected to another end of the tubular container and is configured to emit the reactive gas generated by a reaction between the gas plasma, includes a conductive tube of which an inner diameter is reduced than the another end of the tubular container, the method including:

generating plasma inside the tubular container by supplying gas through the gas supply port and introducing microwave through the microwave introduction port; and processing the workpiece to be processed by supplying reactive gas generated by a reaction between the gas and the plasma into the sample processing room connected to the tubular container, exhausting the gas which is supplied and reactive gas after processing through the gas exhaust port provided to the sample processing room, and irradiating the workpiece to be processed held on the holding table in the sample processing room with the reactive gas.

12. The microwave plasma processing method according to claim 11, wherein inside the tubular container or inside the tubular container and the tubular chamber is kept with a pressure equal to or lower than 10 Torr.

13. The microwave plasma processing method according to claim 12, wherein inside the tubular container or inside the tubular container and the tubular chamber is kept with a pressure equal to or higher than 1 mTorr and equal to or lower than 10 Torr.

14. The microwave plasma processing method according to claim 11, wherein a flow rate of the gas supplied into the tubular container is equal to or larger than 0.01 sccm and equal to or less than 1000 sccm.

15. The microwave plasma processing method according to claim 14, wherein a flow rate of gas supplied into the tubular container is equal to or larger than 0.1 sccm and equal to or less than 500 sccm.

16. The microwave plasma processing method according to claim 11, wherein an output power of the microwave which is supplied is equal to or larger than 10 W and equal to or less than 10000 W.

17. A microwave plasma processing method for processing a workpiece to be processed by using a microwave plasma processing apparatus comprising a microwave plasma generating apparatus having a plurality of microwave plasma generating devices, wherein each of the plurality of the microwave plasma generating devices has:

a tubular container made of a dielectric material;

a tubular chamber arranged to cover the tubular container from outside;

a gas supply port, provided at an end of the tubular container, configured to supply gas inside the tubular container; and a microwave introduction port provided at a side of the tubular chamber, wherein an emission part, that is connected to another end of the tubular container and configured to emit reactive gas generated by a reaction between the gas and plasma, includes a conductive tube of which an inner diameter is reduced than the another end of the tubular container, the microwave plasma processing method including:

generating plasma inside the tubular container by supplying gas through the gas supply port and introducing microwave through the microwave introduction port; and exhausting the reactive gas from the tubular container.

* * * * *